United States Patent
Murashita et al.

[19]

[11] Patent Number: 5,825,315
[45] Date of Patent: Oct. 20, 1998

[54] DATA CODING APPARATUS AND DATA DECODING APPARATUS AND METHODS THEREOF

[75] Inventors: Kimitaka Murashita; Shigeru Yoshida; Yoshiyuki Okada, all of Kawasaki, Japan

[73] Assignee: Fujitsu Limited, Kawasaki, Japan

[21] Appl. No.: 758,891

[22] Filed: Dec. 2, 1996

[30] Foreign Application Priority Data

Feb. 13, 1996 [JP] Japan .................................. 8-025675

[51] Int. Cl.$^6$ ...................................................... H03M 7/00
[52] U.S. Cl. ................................................................ 341/106
[58] Field of Search .................................... 341/106, 107, 341/87, 51, 95

[56] References Cited

U.S. PATENT DOCUMENTS 4,612,532  9/1986  Bacon et al. .
5,537,551  7/1996  Denenberg et al. .

FOREIGN PATENT DOCUMENTS 2277179  10/1994  United Kingdom .

Primary Examiner—Brian K. Young
Attorney, Agent, or Firm—Staas & Halsey

[57] ABSTRACT

Data coding apparatus and decoding apparatuses to encode and decode data at a high speed. A data coding apparatus provided with a code table in which ranks and codes are made corresponding so that a code length becomes larger as the rank becomes lower. A rank holding unit is stored with a corresponding relationship between the character and the rank relative to each context. When the character to be encoded is input, the rank holding unit outputs a rank of that character relative to the context at that time, and the code corresponding to the rank within the code table is output by the rank coding unit. The data coding apparatus is constructed to change the rank of the character used for outputting within the rank holding unit up to a higher rank.

18 Claims, 10 Drawing Sheets

FIG. 3

| RANK | CODE |
|---|---|
| 1 | 0 |
| 2 | 1 0 |
| 3 | 1 1 0 |
| 4 | 1 1 1 0 |
| 5 | 1 1 1 1 0 |
| 6 | 1 1 1 1 1 0 |
| 7 | 1 1 1 1 1 1 0 |
| 8 | 1 1 1 1 1 1 1 0 |
| 9 | 1 1 1 1 1 1 1 1 0 |
| 10 | 1 1 1 1 1 1 1 1 1 0 |
| 11 | 1 1 1 1 1 1 1 1 1 1 0 |

FIG. 4(A)

| CONTEXT | CHARACTER | RANK |
|---|---|---|
| $\alpha\beta$ | $\varepsilon$ | 1 |
|  | E S C | 2 |
|  | $\gamma$ | 3 |

FIG. 4(B)

| CONTEXT | CHARACTER | RANK |
|---|---|---|
| $\alpha\beta$ | E S C | 1 |
|  | $\varepsilon$ | 2 |
|  | $\gamma$ | 3 |

FIG. 5

| CONTEXT | CHARACTER | RANK | CODE |
|---------|-----------|------|------|
| α β | E S C | 1 | 0 |
|  | ε | 2 | 1 0 |
|  | γ | 3 | 1 1 0 |
|  | δ | 4 | 1 1 1 0 |

FIG. 6

| CONTEXT | CHARACTER | RANK | CODE |
|---------|-----------|------|------|
| α β | γ | 1 | 0 |
|  | ε | 2 | 1 0 |
|  | E S C | 3 | 1 1 0 |
|  | δ | 4 | 1 1 1 0 |

FIG. 10

| RANK | CODE |
|---|---|
| 1 | 0 0 0 |
| 2 | 0 0 1 |
| 3 | 0 1 0 |
| 4 | 0 1 1 |
| 5 | 1 0 0 0 |
| 6 | 1 0 0 1 |
| 7 | 1 0 1 0 |
| 8 | 1 0 1 1 |
| 9 | 1 1 0 0 0 |
| 1 0 | 1 1 0 0 1 |
| 1 1 | 1 1 0 1 0 |

DATA CODING APPARATUS AND DATA DECODING APPARATUS AND METHODS THEREOF

BACKGROUND OF THE INVENTION

1. Field of the Invention

The present invention relates generally to a data coding apparatus and a data decoding apparatus and methods thereof, for coding data in a variety of forms and decoding the coded data. The present invention relates more particularly to a data coding apparatus and a data decoding apparatus and methods thereof, used for, e.g., compressing and expanding the data.

2. Description of the Prior Art

With a rapid advancement in computers in recent years, a large capacity of data are treated within the computer, and it is a practice that the data are compressed in rank to reduce a transmission time and to effectively make use of a memory device.

Known are various kinds of coding methods used for compressing the data. Among these coding methods, coding applicable to a variety of data such as character codes, vector data and images is referred to as universal coding. The known universal coding is classified into a dictionary coding which exploits a similarity of the character strings and a statistical coding which exploits a frequency of occurrence of the characters. Note that one unit of data is termed a "character", and a plurality of characters connected are termed a "character string".

According to the dictionary coding (Ziv-Lempel Coding or LZ Coding), the same character string as a character string to be encoded is retrieved from within a buffer called a dictionary, and an intra-buffer position of the retrieved character string and a coincidence length are outputted as codes. That is, according to the dictionary coding, the coding is executed based on the unit of a character string consisting of some characters.

While on the other hand, according to the statistical coding, the occurrence frequencies of the characters that have ever occurred are counted, and a code corresponding to the occurrence frequency of that character is generated per character. According to the statistical coding, when the occurrence frequency of each character is counted corresponding to the character string (context) occurring just anterior to the character, a high compression ratio might be attained. In this case, the coding is, as schematically shown in FIG. 12, realized by an apparatus including a context collecting unit 10 and a dynamic variable length coding unit 12. The context collecting unit stores the character strings and counts a number of occurrences by use of a tree structure as illustrated in FIG. 13, thus obtaining a conditional probability in which each character occurs posterior to a certain context. The dynamic variable length coding unit generates a code having a length in accordance with the conditional probability obtained by the context collecting unit 10. Note that the dynamic variable coding unit uses the conditional probability before being updated when generating the code.

For instance, as schematically shown in FIG. 14, when original data consisting of characters arranged such as "abc" is input, the context collecting unit outputs a conditional probability $\rho$ (c| a,b) at which "c" defines a coding target character occuring subsequent to a context "ab", and thereafter recalculates the conditional probability relative to each character on the basis of the fact that "c" occurs subsequent to "ab". The dynamic variable length coding unit performs variable-length coding of the conditional probability $\rho$ (c| a,b), thereby generating a code for the character "c".

Although a variety of specific processing procedures in the context collecting process are known, this might be roughly classified into a type of fixing an order of the context (the number of characters of the context) and a type of not fixing the order (blending context).

The collection of the contexts of the fixed order has, though advantageous in terms of being easy to actualize, such a defect that a compression ratio to be obtained depends on a content of input data. To be more specific, if a target data is data exhibiting a large character-to-character correlation, a higher compression ratio is obtained by using a higher-order context. If the data exhibiting a small character-to-character correlation is encoded by use of the context of the same order, however, the compression ratio reversely worsens.

Blending of contexts (blending of orders) is a method contrived to avoid the above drawback. According to this blending method, if a certain context often occurs, an order of this context is increased. Whereas if not often, a low order remains unchanged, thus changing the order of each context adaptively to the input data.

Note that for more particulars pertaining to the context collection, see pp. 396–402, "Data Compression Using Adaptive Coding and Partial String Matching", written by JOHN G. CLEARY, et al., IEEE Vol. COM-32 No.4, APRIL, 1984.

Proposed also is statistical coding of coding not the occurrence frequency but the rank of the occurrence frequency. According to an apparatus disclosed in U.S. Pat. No. 4,612,532 ("DATA COMPRESSION APPARATUS AND METHOD"), a part of or a whole of the characters that might be subsequent to one just-anterior character are previously registered. When the registered character occurs, a code corresponding to a rank of that character is outputted. Further, after being encoded, if the rank of that character is not the highest, the character rank is changed up to a higher rank. Moreover, when an unregistered character occurs, this character is encoded in accordance with different procedures.

As explained above, according to the statistical coding, the code is determined from the occurrence frequency of the character, and hence the coding can be done at a higher compression ratio than the dictionary coding. The statistical coding, however, entails recalculating the occurrence frequency whenever one character occurs and generating the code each time, and therefore has such a defect that the coding can not be performed at a high speed.

Note that the occurrence frequencies are not counted, but the rank of the occurrence frequency of the character is stored as a structure of a code tree by a recombining process of the code trees according to splay-tree coding. The splay-tree coding is therefore capable of higher-speed coding than the conventional statistical coding. A processing speed thereof is not, however, higher than the processing speed of the dictionary coding and is not therefore practical.

SUMMARY OF THE INVENTION

It is a primary object of the preset invention, which was contrived under such circumstances, to provide a data coding apparatus and a data decoding apparatus and methods thereof, by which a practical processing speed can be obtained.

A first data coding apparatus according to the present invention comprises a code table storing unit for storing a code table in which ranks and codes are made corresponding so that a length of a code becomes larger at a constant rate as a rank becomes lower, and a rank table storing unit for storing a rank table in which characters and the ranks are made corresponding. The data coding apparatus also comprises a code outputting unit for, when a character to be encoded is input, specifying the rank stored corresponding to this character in the rank table and outputting the code stored corresponding to the thus specified rank in the code table, and a rank updating unit for updating the rank table so that the character encoded by the code outputting unit is provided with such a rank that the code length is shorter by a predetermined number of bits than the code length before being changed.

That is, the first data coding apparatus of the present invention has the code table and the rank table wherein the characters and the codes are made corresponding to each other. The code outputting unit, when the character to be encoded is input, outputs the code corresponding to this character at that time. Then, the rank updating unit updates the rank table so that the character input as a character to be encoded is provided with such a rank that the code length is shorter by the predetermined member of bits than the code length before being changed. As a result of repeating such processes, the characters corresponding to the higher ranks in the rank table become characters exhibiting a high occurrence frequency. Therefore, the code outputting unit outputs the code having the code length corresponding to the occurrence frequency of the character.

Thus, in the first data coding apparatus of the present invention, the code having the short code length corresponding to the occurrence frequency is made corresponding to each character by simply changing the rank of the character. Therefore, according to the present data coding apparatus, the data coding (compression) can be attained at a high speed.

Further, a second data coding apparatus according to the present invention can be constructed by providing the first data coding apparatus with the rank updating unit for changing the rank of the character encoded by the code outputting unit up to a higher rank and changing the rank of the character made corresponding to the theretofore higher rank to the rank made corresponding to the encoded character. According to the thus constructed second data coding apparatus, the coding can be executed simply by replacing the ranks of the two characters, thereby making it possible to attain the coding at an extremely high speed.

Further, a third data coding apparatus according to the present invention can be constructed by providing the first data coding apparatus with the rank updating unit for changing a rank of the character encoded by the code outputting unit up to a higher rank and changing, down to ranks lower by ones, the ranks of the respective characters up to the character made corresponding to a rank higher by one than the encoded character from the character theretofore made corresponding to the higher rank.

In the thus constructed third data coding apparatus, the rank is changed in such a form that past hysteresis remains as it was, and hence the effective coding can be attained.

A fourth data coding apparatus according to the present invention comprises a code table storing unit for storing a code table in which a rank and a code are made corresponding so that a length of the code becomes larger as the rank becomes lower, and a rank table storing unit for storing a rank table in which a character occurred next to a context, a predetermined symbol and a rank are made corresponding in accordance with each of the contexts having a predetermined plurality of orders. The fourth coding apparatus also comprises a rank table retrieving unit for, when a character to be encoded is input, retrieving the rank table corresponding to the context of the highest order that coincides with a character string input just anterior thereto from within the rank table storing unit, and a first code outputting unit for, when the character to be encoded is stored in the rank table retrieved by the rank table retrieving unit, specifying a rank made corresponding to the character to be encoded in that rank table and outputting the code stored corresponding to the specified rank in the code table. The fourth data coding apparatus further comprises a second code outputting unit for, when the character to be encoded is not stored in the rank table retrieved by the rank table retrieving unit, specifying a rank made corresponding to the predetermined symbol in that rank table, outputting the code stored corresponding to the specified rank in the code table, and outputting the code into which the character to be encoded is encoded in conformity with a predetermined coding rule. The fourth data coding apparatus still further comprises a first rank updating unit for, when the first code outputting unit outputs the code, updating the rank table retrieved by the retrieving unit so that the encoded character is provided with a rank to which a code having a code length shorter by a predetermined number of bits than the code length given so far. The fourth data coding apparatus still further comprises a second rank updating unit for, when the second code outputting unit outputs the code, adding the encoded character to the rank table retrieved by the retrieving unit and changing the rank of the character in the rank table so that the rank according to a predetermined rank determinative rule is made corresponding to that encoded character, and a rank table adding unit for, when the order of the context corresponding to the rank table retrieved by the rank table retrieving unit is not the highest order, adding the rank table relative to a context having an order higher by one than that order to the rank table storing unit.

According to the thus constructed fourth coding apparatus, the coding is executed by use of the plurality of contexts having different orders, and the contexts are sequentially updated. Hence, the effective coding can be attained independent of characteristics of the data. Further, the code having the short code length corresponding to an occurrence frequency thereof can be made corresponding to each character by simply changing the rank of the character, thereby making it feasible to perform the coding at the high speed.

A fifth data coding apparatus can be constructed by providing the fourth data coding apparatus with the first rank updating unit for changing the rank of the character encoded by the first code outputting unit up to a higher rank and changing the rank of the character made corresponding to the theretofore higher rank to the rank made corresponding to the character that has been encoded.

According to the thus constructed fifth data coding apparatus, the coding is executed simply by replacing the ranks of the two characters, thus resulting in high-speed coding.

Moreover, a sixth data coding apparatus can be constructed by providing the fourth data coding apparatus with the first rank updating unit for changing the rank of the character encoded by the first code outputting unit to a higher rank and changing, down to ranks lower by ones, the ranks of the characters from the character made corresponding to the theretofore higher rank up to the character made corresponding to the rank higher by one than the encoded character.

In the thus constructed sixth data coding apparatus, the ranks are changed in such a form that the past hysteresis remains as it was, and, therefore, more effective coding can be realized.

In these fourth through sixth data coding apparatuses, it is desirable that the code table storing unit be stored with the plurality of code tables, and, the first code outputting unit and the second code outputting unit respectively should select code tables to be used in accordance with orders of the contexts corresponding to the rank tables retrieved by the rank table retrieving unit.

Further, in the fourth through sixth data coding apparatuses, the code table storing unit may store a plurality of code tables, and the first code outputting unit and the second code outputting unit respectively may select code tables to be used in accordance with the number of characters stored in the rank table retrieved by the rank table retrieving unit.

The fourth through sixth data coding apparatuses adopting such constructions execute the coding in such a form as to take the distribution of occurrence frequency of the character with respect to each context into consideration, and therefore the effective coding can be realized.

A first data decoding apparatus according to the present invention comprises a decode table storing unit for storing a decode table in which a rank and a code are made corresponding so that a length of the code becomes larger as the rank becomes lower, and a rank table storing unit for storing a rank table in which the character and the rank are made corresponding. The first data decoding apparatus also comprises a character outputting unit for, when a code to be decoded is input, specifying the rank stored corresponding to this code in the rank table and outputting the character stored corresponding to the thus specified rank in the rank table, and a rank updating unit for updating the rank table so that the character outputted by the character outputting unit is provided with such a rank that the code length is shorter by a predetermined number of bits than the code length before being changed.

The first decoding apparatus decodes the data encoded by the first data coding apparatus.

The decoding of the data encoded by the second data coding apparatus involves the use of a second data decoding apparatus constructed by providing the first data decoding apparatus with the rank updating unit for changing a rank of the character outputted by the character outputting unit up to a higher rank and changing a rank of the character theretofore made corresponding to the higher rank to the rank given to the outputted character.

Moreover, the decoding of the data encoded by the third data coding apparatus involves the use of a third data decoding apparatus constructed by providing the first data decoding apparatus with the rank updating unit for changing a rank of the character outputted by the character outputting unit up to a higher rank and changing, down to ranks lower by ones, the ranks of the characters up to the character made corresponding to a rank higher by one than the outputted character from the character theretofore made corresponding to the higher rank.

A fourth data decoding apparatus according to the present invention comprises a decode table storing unit for storing a decode table in which a rank and a code are made corresponding so that a length of the code becomes larger as the rank becomes lower, and a rank table storing unit for storing a rank table in which a character occurred next to a context, a predetermined symbol and a rank are made corresponding in accordance with each of the contexts having a predetermined plurality of orders. The fourth data decoding apparatus also comprises a rank table retrieving unit for, when a code to be decoded is input, retrieving the rank table relative to the context of a maximum number of characters that coincides with a character string with the decoding finished so far from within the rank table storing unit, and a rank specifying unit for specifying the rank stored corresponding to the input code in the decode table. The fourth data decoding apparatus further comprises a character specifying unit for specifying the character stored corresponding to the rank specified by the rank specifying unit in the rank table retrieved by the rank table retrieving unit, a first character outputting unit for, if the character specified by the character specifying unit is not the predetermined symbol, outputting this character, and a second character outputting unit for, if the character specified by the character specifying unit is the predetermined symbol, outputting the character into which the code input thereafter is decoded in conformity with a predetermined decoding rule. The fourth data decoding apparatus still further comprises a first rank updating unit for, when the first character outputting unit outputs the character, updates the rank table retrieved by the retrieving unit so that the outputted character is made corresponding to a rank to which a code having a code length shorter by a predetermined number of bits than the code length given so far, a second rank updating unit for, when the second character outputting unit outputs the character, adding this character to the rank table retrieved by the retrieving unit and changing the rank of the character in the rank table so that a rank according to a predetermined rank determinative rule is made corresponding to that character, and a rank table adding unit for, when the order of the context corresponding to the rank table retrieved by the rank table retrieving unit is not the highest order, adding the rank table relative to a context having an order higher by one than that order to the rank table storing unit.

The fourth data decoding apparatus decodes the data encoded by the fourth data coding apparatus.

Decoding of the data encoded by the fifth data coding apparatus involves the use of a fifth data decoding apparatus constructed by providing the fourth data decoding apparatus with the first rank updating unit for changing the rank of the character outputted by the first character outputting unit up to a higher rank and changing the rank of the character made corresponding to the theretofore higher rank to the rank made corresponding to the outputted character.

Moreover, the decoding of the data encoded by the sixth data coding apparatus involves the use of a sixth data decoding apparatus constructed by providing the fourth data decoding apparatus with the first rank updating unit for changing the rank of the character outputted by the first character outputting unit to a higher rank and changing, down to ranks lower by one, the ranks of the characters from the character made corresponding to the theretofore higher rank up to the character made corresponding to the rank higher by one than the outputted character.

The fourth to sixth data decoding apparatuses with the same modifications are employed for the fourth through sixth data coding apparatuses constructed to perform the coding in such a form as to take the distribution of the occurrence frequency of the character for each context into consideration.

A data coding method comprises a rank-to-code corresponding step of making a rank and a code corresponding to each other so that a length of the code becomes larger as the rank becomes lower, and a character-to-rank corresponding step of making each of the characters that have ever become coding targets, to a rank. The data coding method also comprises a code outputting step of specifying the rank made corresponding to the character to be encoded in the character-to-rank corresponding step, and outputting the code made corresponding to the specified rank in the rank-to-code corresponding step, and a rank changing step of changing a corresponding relationship between the character and the rank so that the character encoded in the code outputting step is made corresponding to such a rank that the code length is shorter by a predetermined number of bits than the code length before being changed.

Thus, according to the data coding method of the present invention, the rank relative to the encoded character is changed so that the code length becomes shorter by a predetermined number of bits each time the coding is carried out. Note that the rank is not changed if the code of the encoded character is a code having a minimum code length given in the code table.

For this reason, the code having the code length according to the occurrence frequency of the character is to be outputted in the code outputting step at a stage of finishing the coding of a considerable number of characters. That is, according to the present data coding method, it is feasible to output the code having the code length according to the occurrence frequency of the character to be encoded by simply changing the character rank.

A data decoding method according to the present invention comprises a rank-to-code corresponding step of making a rank and a code so that a length of the code becomes larger as the rank becomes lower, and a character-to-rank corresponding step of making the rank and each of the encoded characters. The data decoding method also comprises a character outputting step of specifying the rank made corresponding in the rank-to-code corresponding step and outputting the character made corresponding in the character-to-rank corresponding step with respect to the specified rank, and a rank changing step of changing a corresponding relationship between the character and the rank so that the character outputted in the character outputting step is made corresponding to such a rank that a code length is shorter by a predetermined number of bits than the code length before being changed.

BRIEF DESCRIPTION OF THE DRAWINGS

The present invention will becomes more fully understood from the detailed description given hereinbelow and the accompanying drawings which are given by way of illustration only, and thus are not limitative of the present invention, and wherein:

FIG. 3 is a diagram showing one example of a code table usable in the data coding apparatus in the first embodiment;

FIG. 4 is a diagram showing one example of a rank table prepared within the data coding apparatus in the first embodiment;

FIG. 5 is an explanatory diagram showing a corresponding relationship between the character and the code in the data coding apparatus in the first embodiment;

FIG. 6 is an explanatory diagram showing a corresponding relationship between the character and the code in the data coding apparatus in the first embodiment;

FIG. 10 is a diagram showing one example of a code table used in the data coding apparatus in the second embodiment;

DETAILED DESCRIPTION OF THE PREFERRED EMBODIMENTS

The present invention will hereinafter be specifically described with reference to the drawings.

First Embodiment

A data coding apparatus and a data decoding apparatus in a first embodiment will be explained.
Data Coding Apparatus FIG. 1 is a block diagram illustrating the data coding apparatus in the first embodiment.

Figure 1:
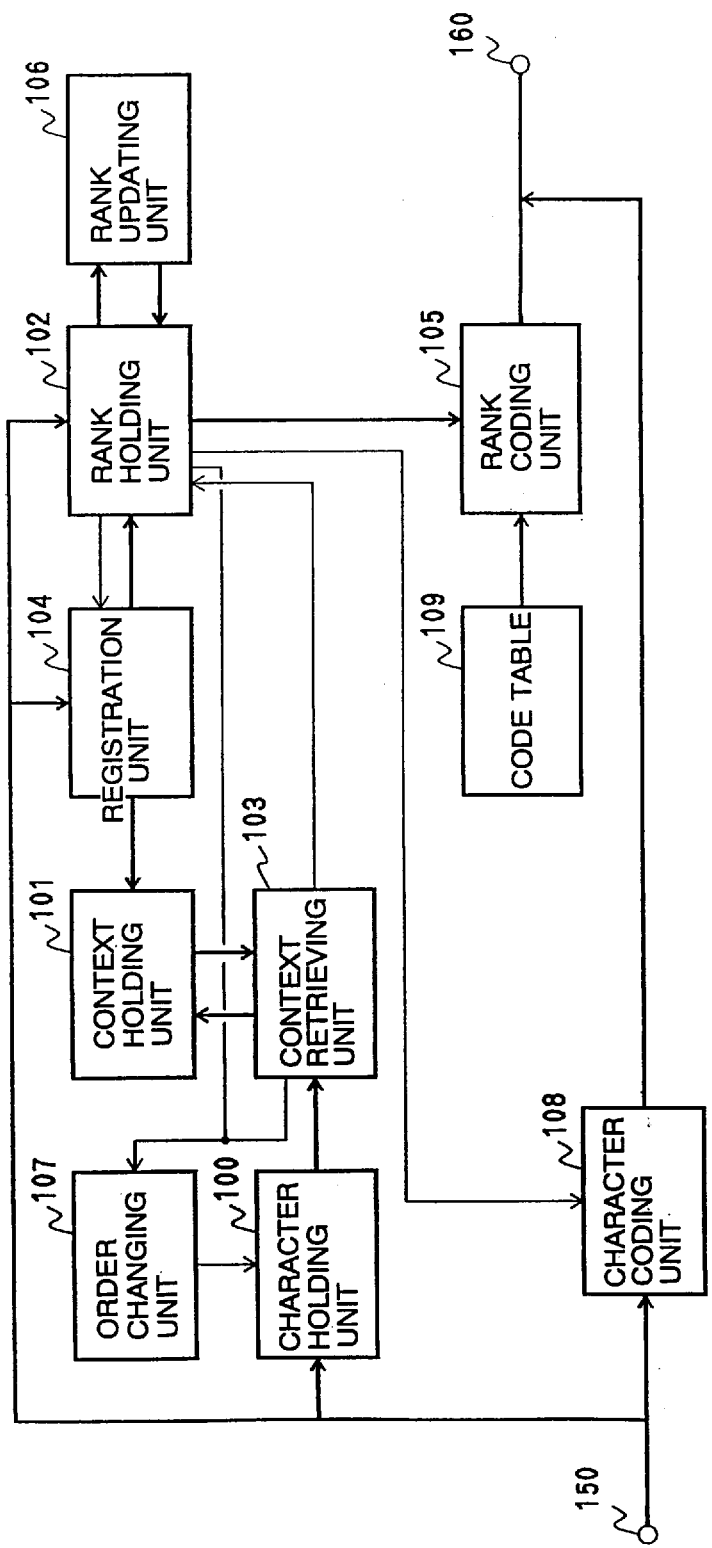
FIG. 1 is a block diagram illustrating a construction of a data coding apparatus in a first embodiment of the present invention.

Coding target characters defined as data to be encoded are input from an input terminal 150 and are, as illustrated in FIG. 1, supplied to a character holding unit 100, a rank holding unit 102, a character coding unit 108 and a registration unit 104.

The character holding unit 100 is provided with a memory area capable of storing a predetermined number of characters. The character holding unit 100, when a new coding target character is input, updates a character string stored in the memory area by use of this coding target character and, in accordance with an indication given from an order changing unit 107, outputs a character string (context) including an indicated number of characters to a context retrieving unit 103. Note that the memory area within the character holding unit 100 is capable of storing the characters for a highest order N of the context (a maximum number of characters of the context) and one more character. The character holding unit 100 outputs, to the context retrieving unit 103, a character string (context) that does not contain a newly input coding target character. Then, when a next coding target character is input, there is outputted a character string containing the coding target character of the last time at the tail thereof.

The order changing unit 107 indicates the character holding unit 100 to output the context of the highest order, i.e., the N-th order at a point of time when starting the encoding process of a certain character. Further, the order changing unit 107, upon receiving an input of a predetermined indication signal from the context retrieving unit 103, indicates the character holding unit 100 to output a context of the order reduced down by one.

On the other hand, the context holding unit 101 is stored (registered) with a plurality of contexts including N-pieces of characters or less, which occurred in the past. The context retrieving unit 103 connected to this context holding unit 101 determines whether or not the same context as the context supplied from the character holding unit 100 is stored in the context holding unit 101. Then, if the same context is registered, the rank holding unit 102 is supplied with an item of context specifying data corresponding to that context. The context specifying data will be explained later.

Whereas if the context coincident with the context supplied from the character holding unit 100 is not registered in the context holding unit 101, the context retrieving unit 103 outputs a predetermined indication signal to the order changing unit 107. With the outputting of this indication signal, it follows that the context retrieving unit 103 receives inputting of the context a smaller number of characters by one character from the character holding unit 100. The context retrieving unit 103 again retrieves a content of the context holding unit 101 by use of the newly input context. The context retrieving unit 103 repeats the above-mentioned operation until the fact of the context being registered is detected, and outputs the context specifying data corresponding the detected context.

The rank holding unit 102 holds rank tables for each context registered in the context holding unit 101. In the rank table relative to a certain context, characters occurred subsequent to that context and a special character "ESC" are stored corresponding to the rank. The above-described context specifying data is data for specifying one rank table pertaining to a certain context among the plurality of rank tables stored in the rank holding unit 102.

As already explained, the coding target character is also input to the rank holding unit 102, and this rank holding unit 102 determines whether or not the same character as the coding target character is stored in the rank table corresponding to the context specifying data notified from the context retrieving unit 103. Then, if the same character as the coding target character is stored therein, a rank of that character is outputted to a rank coding unit 105. Whereas if the same character as the coding target character is not stored therein, the rank corresponding to "ESC" is outputted to the rank coding unit 105. At this time, when a relationship of N>1 with respect to the order N is established, the rank holding unit 102 transmits the indication signal for indicating a change of order to the order changing unit 107. The rank holding unit 102 repeats the same process until the order becomes such as N=1, or until the coding target character is determined to have been stored. Then, the rank holding unit 102, if the coding target character is not stored when the order N is 1, supplies the character coding unit 108 with the predetermined indication signal.

The rank coding unit 105 includes a code table 109 and outputs a code corresponding to the input rank among a variety of codes stored in the code table 109. Note that the present data coding apparatus involves the use of a code table by way of the code table 109, in which the rank is made corresponding to the code so that a code length becomes more elongated as the rank becomes lower.

The character coding unit 108, upon receiving the indication signal given from the rank holding unit 102, encodes the coding target character received from the input terminal 150 and outputs the same character. As already explained, the rank holding unit 102 outputs the rank corresponding to "ESC" to the rank coding unit 105 and thereafter outputs the indication signal to the rank holding unit 102. Therefore, the character coding unit 108, after outputting the code by the rank coding unit 105, outputs the code.

Note that the character coding unit 108 employed herein is the one capable of encoding suitable for the data to be encoded. Further, if the data having no proper coding method is to be encoded, the character coding unit 108 involves the use of the one for outputting the input character as it is.

The rank updating unit 106, when the rank of some character is outputted by the rank holding unit 102, updates the content of the rank table stored in the rank holding unit 102 so that the character used comes to a higher rank, e.g., the first rank, and the character that has been in the first rank decreases down to the theretofore rank of the used character.

The registration unit 104 is provided with the memory area capable of storing a predetermined number characters, and contents of this memory area are sequentially updated when the coding target character is input. The registration unit 104 executes the following processes with reference to the contents of that memory area.

When the character rank holding unit 102 outputs the rank relative to "ESC", the registration unit 104 adds the coding target character to the rank table corresponding to the context specifying data. Further, the registration unit 104, if an order "n" of the context relative to the rank table exploited by the rank holding unit 102 is not coincident with the highest order N, newly registers a context of an (n+1)th order in the context holding unit 101, and also adds the rank table corresponding to the registered context to the rank holding unit 102. Note that the (n+1)th order context to be registered on this occasion is a context including (n+1) pieces of characters input anterior to the coding target character, and the rank table to be added is a rank table containing the coding target character and "ESC", with the first rank being made corresponding to the former and the second rank corresponding to the latter.

Figure 2:
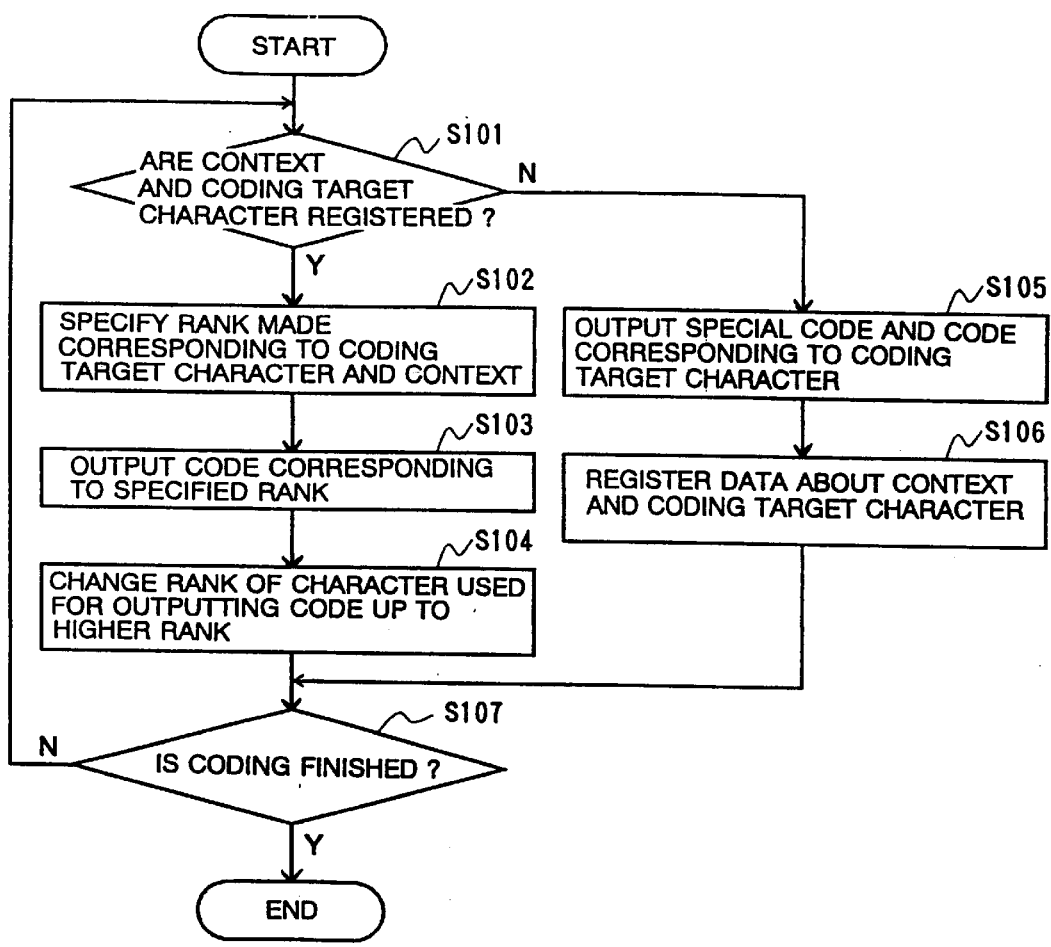
FIG. 2 is a flowchart showing operation procedures of the data coding apparatus in the first embodiment.

The present data coding apparatus constructed of the thus operated units encodes the input data in the procedures shown in FIG. 2.

At first, whether or not a combination of the context with the coding target character is registered, is determined (step S101). Then, if the combination is registered (Y), the rank corresponding to the coding target character is specified (step S102), and the code corresponding to that rank is outputted (step S103). Thereafter, the rank of the character employed for outputting the code is changed up to a higher rank in conformity with a predetermined rule (step S104). If the characters to be encoded are left (step S107; N), the processes from step S101 are executed on a next coding target character.

Whereas if the combination of the context with the coding target character is not registered (step S101; N), there are outputted a special code giving an indication of being a code into which the code to be outputted subsequent thereto is encoded by a different method, and a code corresponding to the coding target character (step S105). Thereafter, an item of data about the combination of that context with the coding target character is registered within the apparatus (step S106), and a process in step S107 is executed.

The operation of the present data coding apparatus will hereinafter be discussed in greater detail. Herein, it is assumed that the highest order of the context be "2", and the table shown in FIG. 3 be used by way of the code table 109. Further, it is assumed that a context "αβ" be registered in the context holding unit 101, and a content of the rank table pertaining to the context "αβ" be as schematically shown in FIG. 4(A).

Under such a condition, if a character "δ" of a character string "αβδ" becomes a coding target character, it follows that the context retrieving unit 103 detects that the context "αβ" is registered and therefore notifies the rank holding unit 102 of this effect. The rank holding unit 102 determines whether or not "δ" defined as the coding target character is registered in the rank table relative to the context "αβ". If the character string "αβδ" does not occur theretofore, as illustrated in FIG. 4(A), "δ" is not registered in the code table, and hence the rank holding unit 102 outputs, to the rank coding unit 105, a signal representing the second rank, i.e., the rank of "ESC". The rank coding unit 105, which has received the signal representing the second rank outputs a code "10" stored corresponding to the second rank within the code table 109 (FIG. 3). As a result, the rank of "ESC" is changed up to the first rank, and the content of the code table becomes as shown in FIG. 4(B).

Thereafter, the order is reduced down by one, and whether or not "δ" posterior to the context "β" in the first-order context is registered, is checked. If the "δ" is registered, the code for the rank of "δ" is outputted. Whereas if "δ" is not registered, as in the case of the second-order, the code of the "ESC" rank is outputted, and thereafter the character coding unit 108 outputs a code into which "δ" is encoded.

Further, the registration unit 104 additionally registers "δ" in the lowest rank within the rank table relative to the context "αβ" in such a form as to synchronize with such encoding. As a result, a corresponding relationship between each character, rank and code that are determined by the code table 109 and the rank table pertaining to the context "αβ" is changed into a relationship shown in FIG. 5.

Hereafter, a character string "αβγ" occurs in the input data, and, if "γ" becomes a coding target character, a corresponding relationship between the code, the rank and "γ" relative to the context "αβ" becomes as shown in FIG. 5. Therefore, the rank coding unit 105 outputs "110" as a code for "γ". Then, the rank updating unit 106 changes the rank of the character "γ" relative to the context "αβ" up to the first rank, while the "ESC" rank that has been the first rank changes down to a third rank that has been the rank of "γ". As a consequence, a relationship between the code and the character that are determined by the code table 109 and the rank table relative to the context "αβ" is changed into a relationship shown in FIG. 6. When "γ" in "αβγ" is once again encoded, it follows that the code "0" is outputted.

Thus, the data coding apparatus in the first embodiment performs encoding by use of the plurality of contexts of different orders, and the contexts are sequentially updated. It is therefore feasible to attain the effective encoding independent of property of the data. Further, the code having a short code length according to a frequency of occurrence thereof is made corresponding to each character by simply replacing the ranks of the two characters, and therefore the encoding can be done at a high speed.

Note that the rank of each character is set according to the frequency of occurrence by replacing the ranks of the two characters in the data coding apparatus in the first embodiment. However, the ranks of the respective characters up to the character given a higher rank by one than the encoded character from the character that has been in the first rank, may be individually changed down to lower ranks by ones. If constructed in this way, it follows that the ranks are changed while past hysteresis remains as it was, and therefore this implies that a processing speed is slightly decreased. However, more effective encoding is to be executed.

Further, the encoded character is not replaced with the character of the first rank but may be replaced with a character of a higher m-th rank or may be inserted in a position of the higher m-th rank. Moreover, the encoded character may be replaced with a character of such a rank that the code length becomes smaller by predetermined bits, or a character of such a rank that the code length becomes ½. Further, as a matter of course, the encoded character can be inserted in such ranks. When the rank is changed in such a form as to relate the rank directly to the code length as described above, although the processing procedures themselves get more or less complicated, the much more effective encoding can be done.

Furthermore, in the data coding apparatus in accordance with the first embodiment, when newly registering the context, and if the context used for encoding is an n-th order, only an (n+1)th order context is registered. The data coding apparatus can be also constructed so as to register en bloc the contexts of a plurality of orders such as n+1, n+2, ... N that are higher than the n-th order. If constructed as described above, this requires a greater number of memory resources, but the higher order encoding can be executed quickly.

Data Decoding Apparatus

Figure 7:
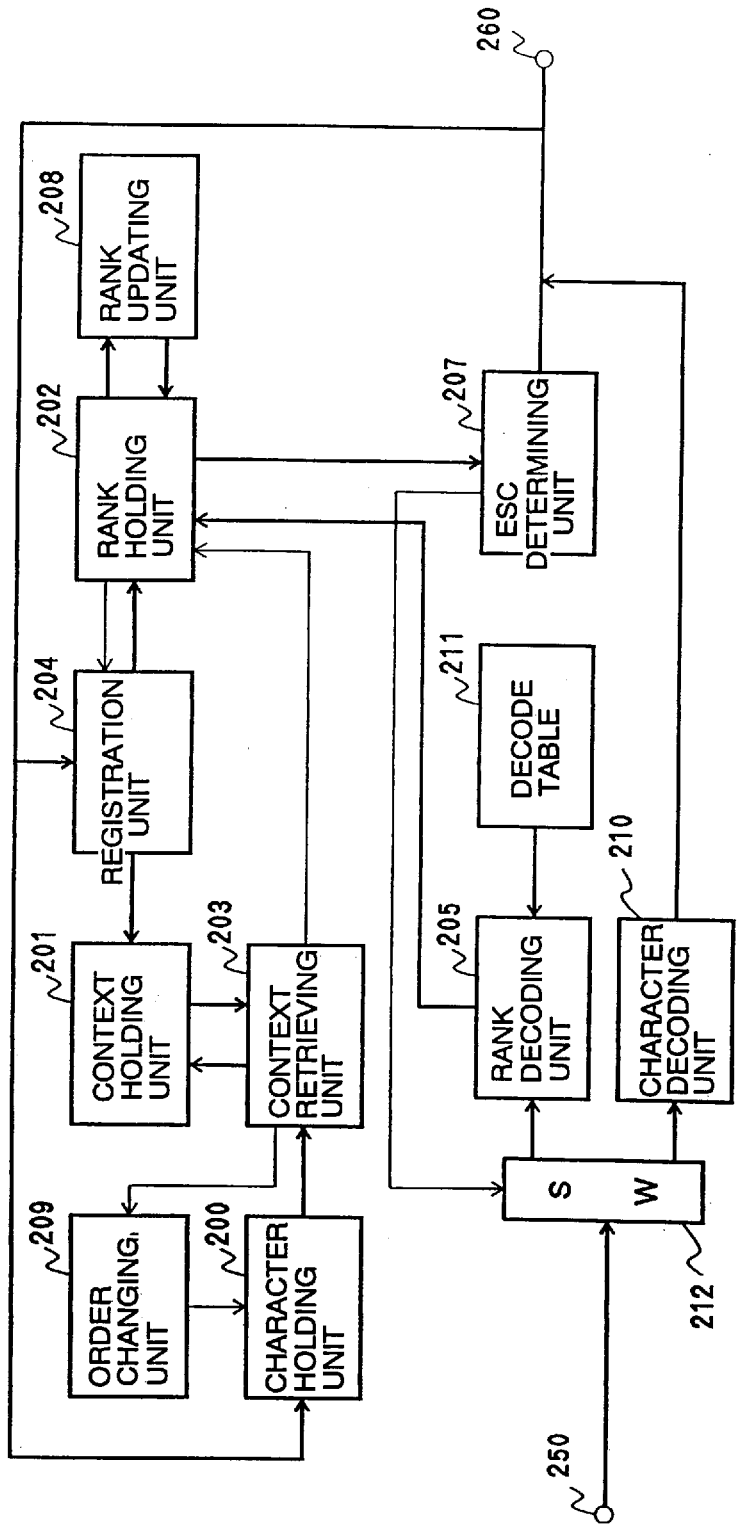
FIG. 7 is a block diagram illustrating a construction of a data decoding apparatus in the first embodiment of the present invention.

The data encoded by the data coding apparatus in the first embodiment are decoded by a data decoding apparatus in the first embodiment, a construction of which is illustrated in FIG. 7.

The data to be decoded are input from an input terminal 250 and normally are supplied to a rank decoding unit 205 including a decode table 211 through a switch 212. The decode table 211 is stored with a corresponding relationship between ranks and codes stored in the code table 109 provided in the data coding apparatus in such a form that the ranks can be retrieved based on the codes. The rank decoding unit 205 supplies the rank holding unit 202 with the rank corresponding to the input code.

The context retrieving unit 203 retrieves the context in such a form as to synchronize with these processes and notifies the rank holding unit 202 of a result of the retrieval.

More specifically, the context retrieving unit 203 determines whether or not the character string (context) supplied from the character holding unit 200 is registered in the context holding unit 201. If registered therein, the rank holding unit 202 is supplied with the context specifying data corresponding to that context. Further, if the character string supplied from the character holding unit 200 is not registered as a context, the context retrieving unit 203 outputs a predetermined indication signal to the order changing unit 209, thereby making the decoded character holding unit 200 output a character string, the number of characters of which is smaller by one. Checked subsequently is whether or not the same context as that character string is registered in the context holding unit 201 with respect to the character string newly supplied from the decoded character holding unit 200.

The rank holding unit 202 is stored with the rank table showing the corresponding relationship between the rank, "ESC" and the character that has ever occurred posterior to that context with respect to each context registered in the context holding unit 201. The rank holding unit 202 specifies one rank table on the basis of the context specifying data and outputs, to an ESC determining unit 207, the character made corresponding to the rank supplied from the rank decoding unit 205 in the thus specified rank table.

The rank updating unit 208, when the rank holding unit 202 outputs the character, changes the rank of the used character up to the first rank and provides the character that has been in the first rank with the previous rank of the used character.

The ESC determining unit 207 determines whether or not the input character is "ESC". If the input character is not "ESC", this character is output to an output terminal 260. When the ESC determining unit 207 outputs the character, it follows that the decoding for one character is completed, and the character string stored in the character holding unit 200 is updated by the decoded character. On the other hand, if the input character is defined as "ESC", the ESC determining unit 207 outputs not this character but a switchover indication to a switch (SW) 212. The switch 212 receiving the switchover indication supplies the character decoding unit 210 with the data for one character input hereafter via the input terminal 250, and the character decoding unit 210 decodes the input data and outputs the decoded data. When the character decoding unit 210 outputs the character, it follows that the decoding for one character is completed, and the character string stored in the character holding unit 200 is updated by the decoded character.

The registration unit 204, when the character decoding unit 210 decodes the character, registers the decoded character in the rank table designated by the context specifying data within the rank holding unit 202. Note that this registration is executed so that the rank of that character comes to the first rank. Further, if the order of the context used for decoding the character is not the highest order either in a case where the character decoding unit 210 outputs the character or in a case where the rank decoding unit 207 outputs the character, the registration unit 204 registers the character holding unit 201 with a context having an order higher by one than the context at that time. Created subsequently in the rank holding unit 202 is a rank table corresponding to the context registered in the context holding unit 201.

Figure 8:
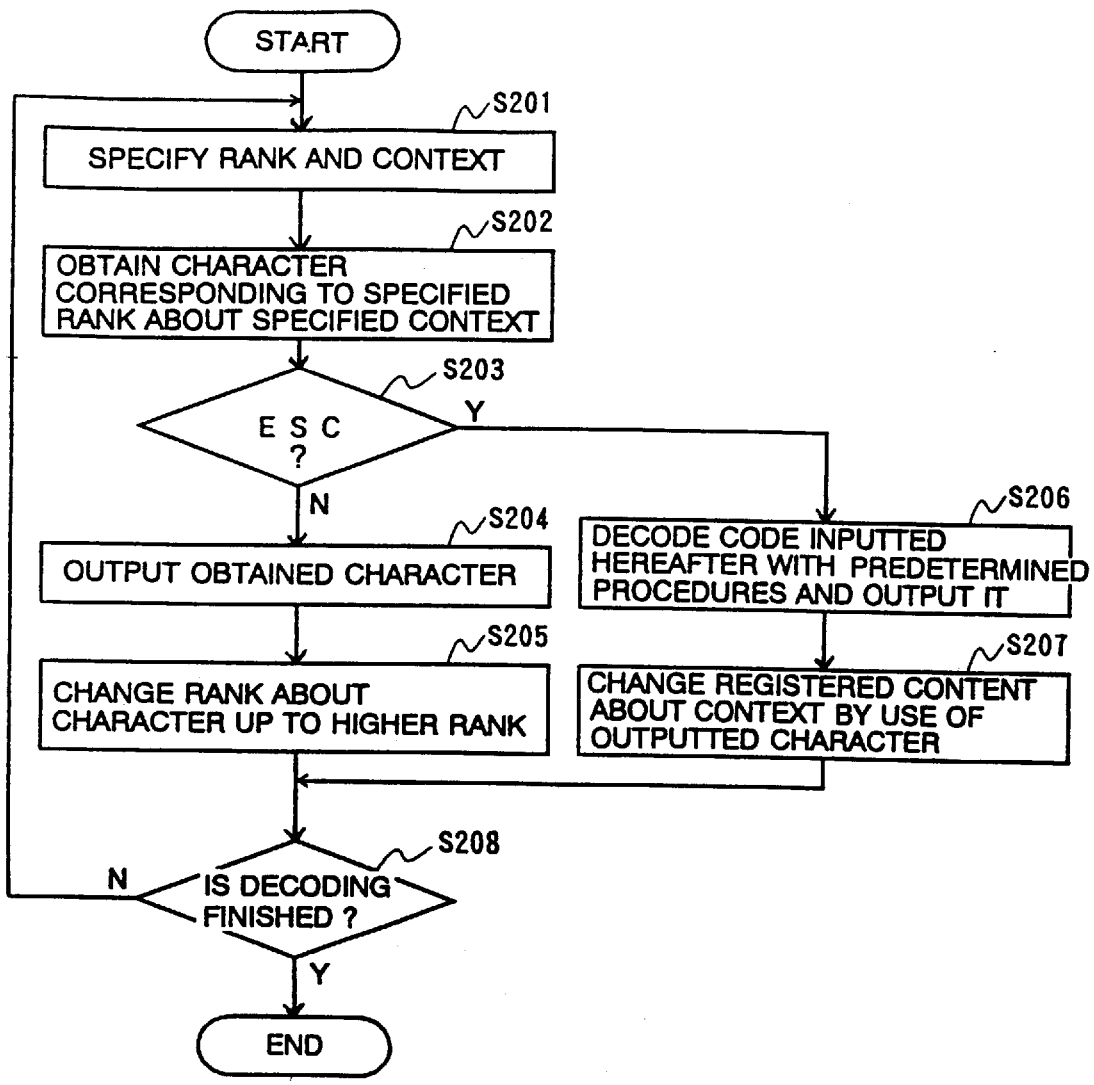
FIG. 8 is a flowchart showing operation procedures of the data decoding apparatus in the first embodiment.

The present data decoding apparatus constructed of the thus operated units decodes the input data in the procedures shown in FIG. 8.

More specifically, to start with, the rank corresponding to the input code is specified as well as specifying the context (step S201). Obtained is the registered character made corresponding to the specified rank (step S202). Subsequently, whether that character is "ESC" or not is checked. If the character is not "ESC" (step S203; N), the character obtained in step S202 is output (step S204). Executed then is a process of changing the rank relative to that character up to a higher rank (step S205). If data to be decoded is left (step S208; N), the decoding of a next code starts.

Further, if the character obtained in step S202 is "ESC" (step S203; Y), the character is decoded and output in such a form that the code input hereafter does not make use of the rank (step S206). Performed subsequently is such a change in the content of the registration relative to the context as updating or a new creation of the rank table by use of that character (step S207).

Thus, in the data decoding apparatus in the first embodiment, the corresponding relationship between the rank and the character is changed by such a simple process as replacing the ranks of the two characters, and the code is decoded based on this corresponding relationship, with the result that the decoding is carried out at a high speed.

Further, in the data decoding apparatus in the first embodiment, the rank is changed by replacing the characters. In the case of employing, as the data coding apparatus, the apparatus for changing the ranks of the respective characters up to the character provided with the rank higher by one than the encoded character, down to the ranks lower by ones, however, the rank changing unit 208 of the data decoding apparatus changes, down to the ranks lower by ones, the ranks of the respective characters up to the character provided with the rank higher by one than the character used for decoding from the character that has been in the first rank.

Second Embodiment

There will be described constructions and operations of the data coding apparatus and the data decoding apparatus in a second embodiment of the present invention.

Data Coding Apparatus

Figure 9:
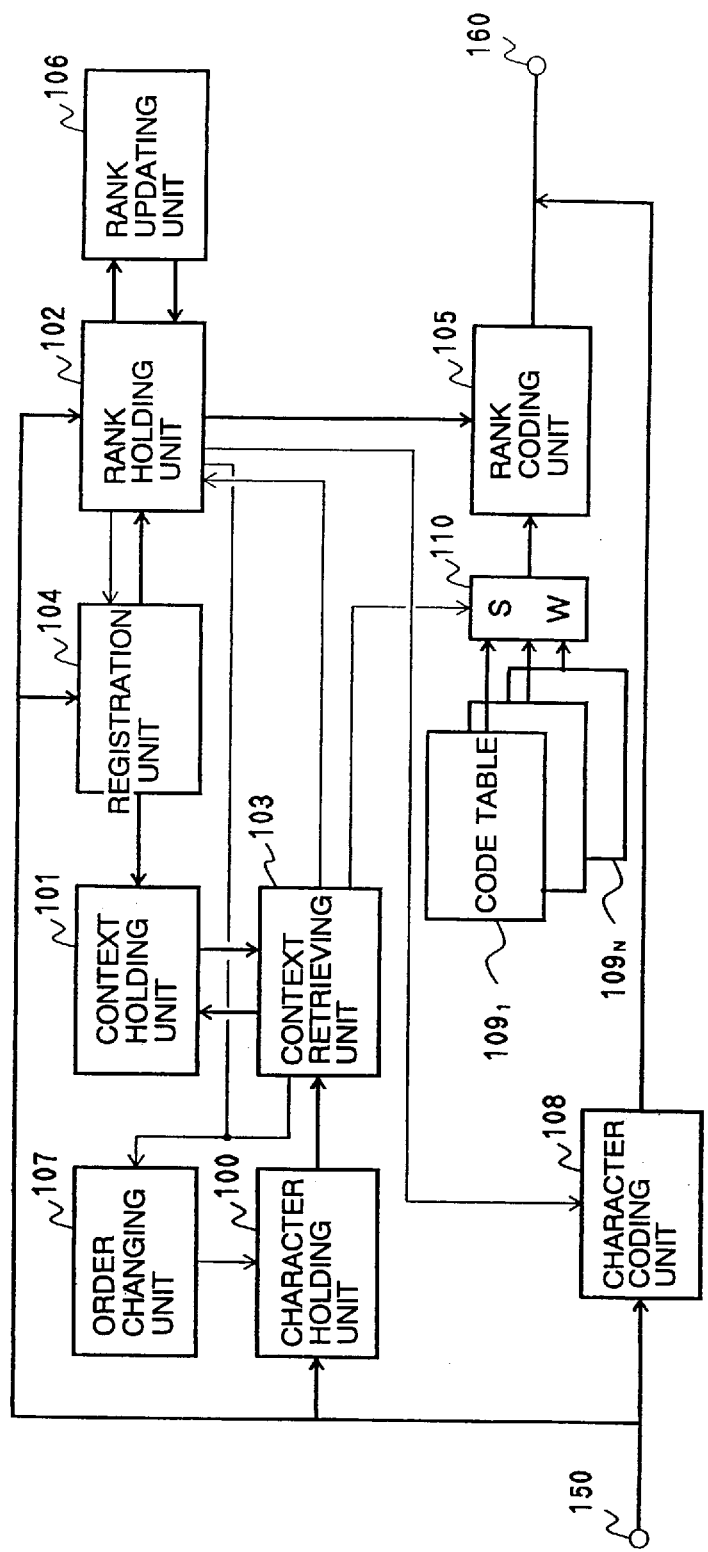
FIG. 9 is a block diagram illustrating a construction of the data coding apparatus in a second embodiment of the present invention.

FIG. 9 is a block diagram illustrating the data coding apparatus in the second embodiment of the present invention. The data coding apparatus in accordance with the second embodiment is constructed based on the data coding apparatus in the first embodiment, and the fundamental operations of the respective units are the same as the operations in the first embodiment. Therefore, the explanation is concentrated on only elements having different constructions and different operations.

As illustrated in FIG. 9, in the data decoding apparatus in the second embodiment, a plurality of code tables $109_1$–$109^N$ are connected via a switch 110 to the rank coding unit 105. The switch 110 is a circuit for connecting one of the code tables 109 to the rank coding unit 105 and operates corresponding to an indication signal transmitted from the context retrieving unit 103. Further, the context retrieving unit 103 is so constructed, when finding out the same context as the context supplied from the character holding unit 100 within the context holding unit 101, as to notify the switch 110 of the order of that context.

Used as the code tables $109_1$–$109_N$ are the code tables in which the ranks and the codes are made corresponding to each other to elongate the code length according to the ranks. Specific corresponding relationships between the ranks and the codes in the respective code tables 109 are, however, different from each other. When notified of a lower order, an equilibrium code table as shown in FIG. 10 is employed. When notified of a higher order, a code table exhibiting differences as shown in FIG. 3 is employed.

That is, the second data coding apparatus performs the more effective coding by exploiting such a fact that a distribution of occurrence probability of each character with respect to a lower-order context is generally more sluggish than a distribution of occurrence probability of each character with respect to a higher-order character.

Further, the data coding apparatus can also be constructed to select the code table in accordance with not the order of the context, but the number of characters stored for every context. Incidentally, in this case, the distribution of occurrence probability of each character at a stage where a multiplicity of characters are registered is normally more sluggish than a distribution of occurrence probability of each character at a stage where a small number of characters are merely registered. Hence, the equilibrium code table is used for the context having a large number of stored characters, while the code table having differences is used for the context having a small number of characters.

Data Decoding Apparatus

Figure 11:
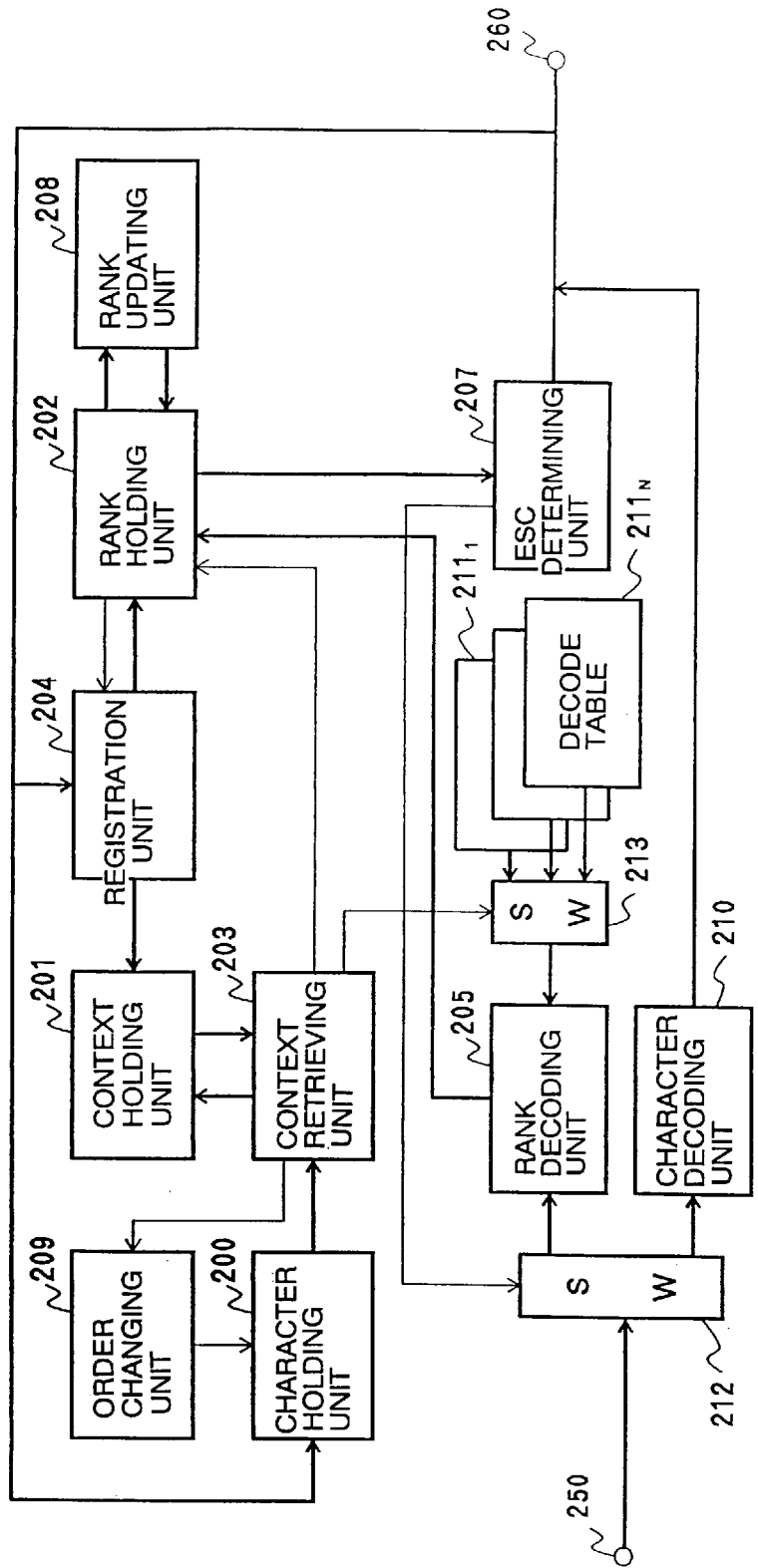
FIG. 11 is a block diagram illustrating a construction of the data decoding apparatus in the second embodiment of the present invention.
Figure 12:
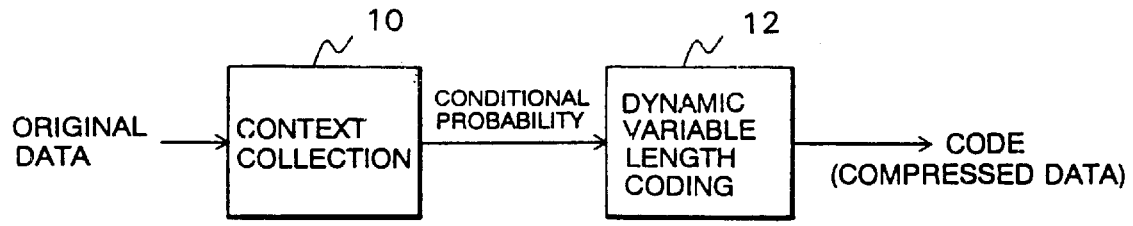
FIG. 12 is a diagram showing the principle of probability static coding in which contexts are collected.
Figure 13:
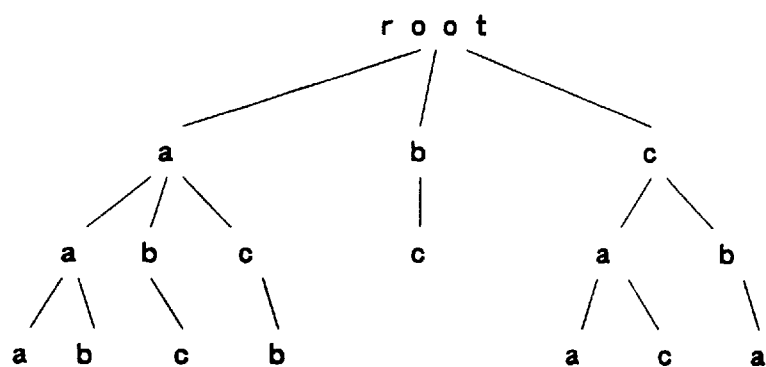
FIG. 13 is a diagram showing one example of a tree structure used when collecting the contexts.
Figure 14:
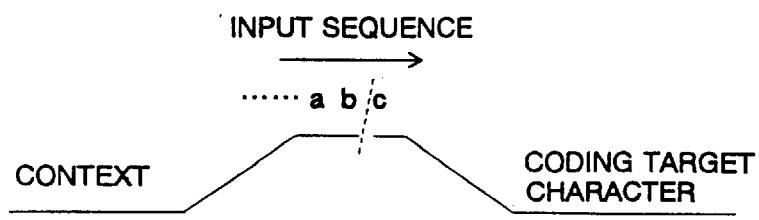
FIG. 14 is a diagram showing a relationship between a context and a coding target character.

FIG. 11 is a block diagram illustrating the data decoding apparatus in the second embodiment of the present invention. This data decoding apparatus is employed in combination with the data coding apparatus shown in FIG. 9.

As illustrated in FIG. 11, the data decoding apparatus includes a plurality of decode table $211^1$–$211_N$. The context retrieving unit 203, when finding out the context as the context supplied from the character holding unit 201 within the context holding unit 201, notifies the switch 213 of the order of that context. Then, the switch 213 connects one of the decode tables 211 that corresponds to the notified order, to the rank decoding unit 205.

Note that if the data coding apparatus is constructed to select the code table in accordance with not the order of the context, but the number of characters stored for every context, the data decoding apparatus is also constructed to select the code table in accordance with the number of characters stored for every context.

As discussed above, the data coding apparatus and the data decoding apparatus according to the present invention execute coding and decoding by such a simple process as to change the ranks made corresponding to the characters. The data coding apparatus and the data decoding apparatus of the present invention are therefore capable of coding and decoding the data at the high speed.

This invention being thus described, it will be obvious that same may be varied in same way. Such variations are not regarded as a departure from the spirit and scope of the invention, and all such modifications would be obvious to one skilled in the art intended to be included within the scope of the following claims.

What is claimed is:

1. A data coding apparatus comprising:

code table storing means for storing a code table in which ranks and codes are made corresponding so that a length of each code becomes larger as the corresponding rank becomes lower;

rank table storing means for storing a rank table in which characters and the ranks are made corresponding;

code outputting means for, when one of the characters to be encoded is input, specifying the rank stored corresponding to the one character in the rank table and outputting the code stored corresponding to the specified rank in said code table; and rank updating means for updating the rank table so that the one character encoded by said code outputting means has the corresponding rank with a code length which is shorter by a predetermined number of bits than the code length of the one character before being changed.

2. A data coding apparatus according to claim 1, wherein said rank updating means changes the rank of the one character encoded by said code outputting means up to a higher rank and changes the rank of the character previously corresponding to the higher rank to the rank of the one character prior to encoding.

3. A data coding apparatus according to claim 1, wherein said rank updating means changes the rank of the one character encoded by said code outputting means up to a higher rank and changes the ranks of the respective characters from the character corresponding to a rank higher by one than that of the encoded character prior to encoding to the character corresponding to the higher rank prior to encoding, down to respective ranks lower by one.

4. A data coding apparatus comprising:

code table storing means for storing a code table in which ranks and codes are made corresponding so that a length of each code becomes larger as the corresponding rank becomes lower;

rank table storing means for storing rank tables corresponding to contexts having a predetermined plurality of orders, wherein characters occurring next to the contexts each have a corresponding predetermined symbol and rank;

rank table retrieving means for, when one of the characters to be encoded is input, retrieving the rank table from within said rank table storing means corresponding to the context of the highest order that coincides with a character string input just anterior thereto;

first code outputting means for, when the one character to be encoded is stored in the rank table updated by said rank updating means, specifying the rank made corresponding to the one character to be encoded in the rank table and outputting the code stored corresponding to the specified rank in the code table;

second code outputting means for, when the one character to be encoded is not stored in the rank table retrieved by said rank table retrieving means, specifying a rank made corresponding to the predetermined symbol in that rank table, outputting the code stored corresponding to the rank, and outputting the code of the one character, wherein the one character is encoded in conformity with a predetermined coding rule;

first rank updating means for, when said first code outputting means outputs the code, updating the rank table retrieved by said retrieving means so that the one character is provided with a rank which has a corresponding code having a code length shorter by a predetermined number of bits than the code length prior to encoding;

second rank updating means for, when said second code outputting means outputs the code, adding the one character to the rank table retrieved by said rank table retrieving means and changing the rank of the one character in the rank table according to a predetermined rank determinative rule; and rank table adding means for, when the order of the context corresponding to the rank table retrieved by said rank table retrieving means is not the highest order, adding to said rank table storing means the rank table relative to the one of the contexts having an order higher by one than the order of the context higher in the rank table.

5. A data coding apparatus according to claim 4, wherein said first rank updating means changes the rank of the one character encoded by said first code outputting means up to a higher rank and changes the rank of the character previously corresponding to the higher rank to the rank of the one character prior to encoding.

6. A data coding apparatus according to claim 4, wherein said first rank updating means changes the rank of the one character encoded by said first code outputting means up to a higher rank, and changes the ranks of the respective characters from the character corresponding to a rank higher by one than that of the encoded character prior to encoding to the character corresponding to the higher rank prior to encoding, down to respective ranks lower by one.

7. A data coding apparatus according to claim 4, wherein:

said code table storing means stores a plurality of code tables;

said first code outputting means selects one of the code tables to be used in accordance with the order of the context corresponding to the rank table retrieved by said rank table retrieving means; and said second code outputting means selects one of the code tables to be used in accordance with the order of the context corresponding to the rank table retrieved by said rank table retrieving means.

8. A data coding apparatus according to claim 4, wherein:

said code table storing means stores a plurality of code tables;

said first code outputting means selects one of the code tables to be used in accordance with the number of characters stored in the rank table retrieved by said rank table retrieving means; and said second code outputting means selects one of the code tables to be used in accordance with the number of characters stored in the rank table retrieved by said rank table retrieving means.

9. A data decoding apparatus comprising:

decode table storing means for storing a decode table in which ranks and codes are made corresponding so that a length of each code becomes larger as the corresponding rank becomes lower;

rank table storing means for storing a rank table in which characters and ranks are made corresponding;

character outputting means for, when one of the codes to be decoded is input, specifying the rank stored corresponding to the one code in the rank table and outputting the character stored corresponding to the specified rank in said rank table; and rank updating means for updating the rank table so that the one character output by said character outputting means has the corresponding rank with a code length which is shorter by a predetermined number of bits than the code length of the one character before being changed.

10. A data decoding apparatus according to claim 9, wherein said rank updating means changes the rank of the one character output by said character outputting means up to a higher rank and changes the rank of the character previously corresponding to the higher rank to the rank of the one character prior to being decoded.

11. A data decoding apparatus according to claim 9, wherein said rank updating means changes a rank of the one character output by said character outputting means up to a higher rank and changes the ranks of the respective characters from the character corresponding to a rank higher by one than that of the one character prior to decoding to the character corresponding to the higher rank prior to decoding, down to respective ranks lower by one.

12. A data decoding apparatus comprising:

decode table storing means for storing a decode table in which ranks and codes are made corresponding so that a length of each code becomes larger as the corresponding rank becomes lower;

rank table storing means for storing rank tables corresponding to contexts having a predetermined plurality of orders, wherein characters occurring next to the contexts each have a corresponding, predetermined symbol and rank;

rank table retrieving means for, when each code to be decoded is input, retrieving the rank table from within said rank table storing means corresponding to the context of a maximum number of characters that coincides with a character string previously decoded;

rank specifying means for specifying the rank stored corresponding to an input code in the decode table;

character specifying means for specifying the one character stored corresponding to the rank specified by said rank specifying means in the rank table retrieved by said rank table retrieving means;

first character outputting means for, if the one character specified by said character specifying means is not the predetermined symbol, outputting the one character;

second character outputting means for, if the one character specified by said character specifying means is the predetermined symbol, outputting the one character into which the code input thereafter is decoded in conformity with a predetermined decoding rule;

first rank updating means for, when said first character outputting means outputs the one character, updating the rank table retrieved by said retrieving means so that the one character is provided with a rank which has a corresponding code having a code length shorter by a predetermined number of bits than the code length prior to decoding;

second rank updating means for, when said second character outputting means outputs the one character, adding the one character to the rank table retrieved by said rank table retrieving means and updating the rank table according to a predetermined rank determinative rule; and rank table adding means for, when the order of the context corresponding to the rank table retrieved by said rank table retrieving means is not the highest order, adding to said rank table storing means the rank table relative to the one of the contexts having an order higher by one than the order of the context higher in the rank table.

13. A data decoding apparatus according to claim 12, wherein said first rank updating means changes the rank of the character output by said first character outputting means up to a higher rank and changes the rank of the character previously corresponding to the higher rank to the rank of the one character prior to being decoded.

14. A data decoding apparatus according to claim 12, wherein said first rank updating means changes the rank of the one character output by said first character outputting means to a higher rank and changes the ranks of the respective characters from the character corresponding to a rank higher by one than that of the one character prior to decoding to the character corresponding to the higher rank prior to decoding, down to respective ranks lower by one.

15. A data decoding apparatus according to claim 12, wherein:

said decode table storing means stores a plurality of decode tables;

said first character outputting means selects one of the decode tables to be used in accordance with the order of the context corresponding to the rank tables retrieved by said rank table retrieving means; and said second character outputting means selects one of the decode tables to be used in accordance with the order of the context corresponding to the rank tables retrieved by said rank table retrieving means.

16. A data coding apparatus according to claim 12, wherein:

said decode table storing means stores a plurality of decode tables;

said first character outputting means selects one of the decode tables to be used in accordance with the number of characters stored in the rank table retrieved by said rank table retrieving means; and said second character outputting means selects one of the decode tables to be used in accordance with the number of characters stored in the rank tables retrieved by said rank table retrieving means.

17. A data coding method comprising:

a rank-to-code corresponding step of making corresponding ranks and codes correspond to each other so that a length of each code becomes larger as the corresponding rank becomes lower;

a character-to-rank corresponding step of making characters that were previous coding targets and ranks correspond;

a code outputting step of specifying the rank made corresponding to the one character to be encoded in said character-to-rank corresponding step, and outputting the code corresponding to the specified rank in said rank-to-code corresponding step; and a rank changing step of changing a corresponding relationship between the one character and the corresponding rank so that the one character encoded in said code outputting step has the corresponding rank with a code length which is shorter by a predetermined number of bits than the code length of the one character before being changed.

18. A data decoding method comprising:

a rank-to-code corresponding step of making ranks and codes correspond to each other so that a length of each code becomes larger as the corresponding rank becomes lower;

a character-to-rank corresponding step of making characters that were previous coding targets and ranks correspond;

a character outputting step of specifying the rank made corresponding in said rank-to-code corresponding step and outputting the one character made corresponding to the rank in said character-to-rank corresponding step; and a rank changing step of changing corresponding relationship between the one character and the rank so that the one character output in said character outputting step has the corresponding rank with a code length which is shorter by a predetermined number of bits than the code length of the one character before being changed.

* * * * *